(12) United States Patent
Lee et al.

(10) Patent No.: US 8,525,147 B2
(45) Date of Patent: Sep. 3, 2013

(54) SEMICONDUCTOR DEVICES INCLUDING A TRANSISTOR WITH ELASTIC CHANNEL

(75) Inventors: Ji-myoung Lee, Yongin-si (KR); Min-sang Kim, Seoul (KR); Dong-won Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 119 days.

(21) Appl. No.: 13/089,477

(22) Filed: Apr. 19, 2011

(65) Prior Publication Data

US 2011/0260136 A1    Oct. 27, 2011

(30) Foreign Application Priority Data

Apr. 27, 2010  (KR) .................. 10-2010-0039169

(51) Int. Cl.
*H01L 29/06* (2006.01)
(52) U.S. Cl.
USPC ........................................ 257/9; 257/E29.04
(58) Field of Classification Search
CPC .............. H01L 29/06; H01L 29/1037; H01L 29/42356; H01L 29/1606; H01I 29/1029
USPC ................................................ 257/244, 286
See application file for complete search history.

(56) References Cited

U.S. PATENT DOCUMENTS

| | | | |
|---|---|---|---|
| 2009/0173938 A1* | 7/2009 | Honda et al. | 257/43 |
| 2009/0181502 A1 | 7/2009 | Parikh et al. | |
| 2009/0225592 A1 | 9/2009 | Lau et al. | |
| 2010/0258787 A1* | 10/2010 | Chae et al. | 257/39 |

FOREIGN PATENT DOCUMENTS

JP    2008-0205272    9/2008

* cited by examiner

*Primary Examiner* — Eva Yan Montalvo
(74) *Attorney, Agent, or Firm* — Myers Bigel Sibley & Sajovec

(57) ABSTRACT

A semiconductor device that may control a formation of a channel is disclosed. The semiconductor device includes a gate region including a first area, an insulating layer disposed on portions of a top surface of the gate region corresponding to both ends portions of the first area, first and second electrodes formed on the insulating layer to be spaced apart from each other, an elastic conductive layer disposed between the first and second electrodes and the insulating layer and having a shape that varies according to an electrostatic force based on voltages applied to the first electrode, the second electrode, and the gate region, and a gate insulating region disposed between the elastic conductive layer and the first area of the gate region.

20 Claims, 14 Drawing Sheets

SEMICONDUCTOR DEVICES INCLUDING A TRANSISTOR WITH ELASTIC CHANNEL

CROSS-REFERENCE TO RELATED APPLICATIONS

This application claims the benefit of Korean Patent Application No. 10-2010-0039169, filed on Apr. 27, 2010, in the Korean Intellectual Property Office, the disclosure of which is incorporated herein in its entirety by reference.

BACKGROUND

As memory devices become smaller in size and faster in operation, demands for higher integration and faster operation of semiconductor devices in the memory devices have increased. Since microelectromechanical system (MEMS) or nanoelectromechanical system (NEMS) semiconductor devices configured by combining electrical elements and mechanical elements may boast reduced cost, size, and power consumption, the demands for greater integration and faster operation of semiconductor devices may be satisfied by the MEMS or NEMS semiconductor devices.

SUMMARY

Provided are semiconductor devices that may form an electron mobility channel based on an electrostatic force between the elastic conductive layer and a gate region by including an elastic conductive layer having high electron mobility and flexibility.

Additional aspects will be set forth in part in the description which follows and, in part, will be apparent from the description, or may be learned by practice of the presented embodiments.

In some example embodiments, a semiconductor device including an elastic channel transistor includes: a gate region comprising a first area; an insulating layer disposed on portions of a top surface of the gate region corresponding to both side ends portions of the first area; first and second electrodes formed on the insulating layer to be spaced apart from each other; an elastic conductive layer disposed between the first and second electrodes and the insulating layer and having a shape that varies according to an electrostatic force based on voltages applied to the first electrode, the second electrode, and the gate region; and a gate insulating region disposed between the elastic conductive layer and the first area of the gate region.

The gate insulating region may be a cavity defined by the gate region and the elastic conductive layer. For example, the gate insulating region may include a silicon oxide film ($Si_xO_y$), an aluminum oxide film ($Al_xO_y$), a hafnium oxide film ($Hf_xO_y$), a zirconium oxide film ($Zr_xO_y$), an yttrium oxide film ($Y_xO_y$), a lanthanum oxide film ($La_xO_y$), a tantalum oxide film ($Ta_xO_y$), a praseodymium oxide film ($Pr_xO_y$), and a titanium oxide film ($Ti_xO_y$), an aluminum silicon oxide film ($Al_xSi_yO_z$), a zirconium silicon oxide film ($ZrSi_xO_y$), or a hafnium silicon oxide film ($HfSi_xO_y$), or a combination thereof.

The first area may be formed to have a round cross-sectional shape that is inwardly curved. For example, the first area may be formed by performing isotropic wet etching on the gate region.

The elastic conductive layer may be charged by a first control voltage applied to the first electrode, wherein when a voltage applied to the second electrode has substantially the same polarity as a voltage of the first control voltage that does not change a polarity of the elastic conductive layer charged by the first control voltage, a channel is determined to be formed in the elastic conductive layer based on the first control voltage and a second control voltage applied to the gate region. When the second control voltage has a polarity opposite to that of the first control voltage, the elastic conductive layer may be spaced apart from the gate region not to form the channel. When the second control voltage has substantially the same polarity as a polarity of the first control voltage, the elastic conductive layer may have a channel formed therein adjacent to the gate region.

The semiconductor device may further include a support structure formed on the first and second electrodes and defining a cavity over the elastic conductive layer.

When a power supply voltage is not applied to the elastic conductive layer, the elastic conductive layer may maintain its shape right before the power supply voltage is applied to the elastic conductive layer due to its elasticity.

In an operating step of the semiconductor device, a voltage applied to the first electrode may be provided to the second electrode in response to a voltage applied to the gate region.

The elastic conductive layer may be formed by exfoliation process that involves attaching single-crystal graphite to a top surface of the insulating layer and attaching a part of the single-crystal graphite to the insulating layer.

In some example embodiments, a semiconductor device includes: a word line extending in a first direction; a bit line extending in a second direction different from the first direction; a gate region comprising a first area and electrically connected to the word line; an insulating layer disposed on portions of a top surface of the gate region corresponding to both side end portions of the first area; a first electrode formed on the insulating layer and electrically connected to the bit line; a second electrode formed on the insulating layer to be spaced apart from the first electrode with the first area between the second electrode and the first electrode; an elastic conductive layer disposed between the first and second electrodes and the insulating layer and having a shape that varies according to an electrostatic force based on voltages applied to the first and second electrodes and the gate region; a gate insulating region disposed between the elastic conductive layer and the first area of the gate region; and a support structure formed on the first and second electrodes and defining a cavity over the elastic conductive layer. The semiconductor device may further include: a first p-n junction region connected between the word line and the gate region; and a second p-n junction region comprising a first terminal connected to the gate region. The semiconductor device may further include a logic element connected to a second terminal of the second p-n junction region. The logic element may perform a logical OR operation or a logical AND operation.

In a setting step, when a word line voltage is applied to the word line and a bit line voltage having substantially the same polarity as a polarity of the word line voltage is applied to the bit line so that the elastic conductive layer has a channel formed therein adjacent to the gate region, the bit line voltage may be provided to the second electrode in response to an output of a logic element.

In a setting step, when a word line voltage is applied to the word line and a bit line voltage having a polarity substantially opposite to a polarity of the word line voltage is applied to the bit line so that the elastic conductive layer is spaced apart from the gate region not to form a channel, the bit line voltage may not be provided to the second electrode irrespective of an output of a logic element.

In some example embodiments, there is provided a semiconductor device including an elastic channel transistor includes: a gate region comprising a first area having a round cross-sectional shape that is inwardly curved, the gate region receiving a gate voltage; an insulating layer disposed on portions of a top surface of the gate region corresponding to both side end portions of the first area; a first electrode formed on the insulating layer and receiving a control voltage; a second electrode formed on the insulating layer to be spaced apart from the first electrode with the first area between the second electrode and the first electrode; an elastic conductive layer comprising graphene, disposed between the first and second electrodes and the insulating layer, and having a shape that varies according to an electrostatic force generated between the elastic conductive layer and the gate region based on the control voltage and the gate voltage; a gate insulating region disposed between the elastic conductive layer and the first area of the gate region; and the elastic channel transistor formed on the first and second electrodes, defining a cavity over the elastic conductive layer, and comprising a support structure supported by a porous film. The gate insulating region may include a cavity and a high-k film.

When the control voltage has the same polarity as a polarity of the gate voltage, or when a sum of the control voltage and the gate voltage is greater than a predetermined pull-out voltage, the elastic conductive layer may be spaced apart from the gate electrode not to form a channel.

When the control voltage has a polarity opposite to the polarity of the gate voltage, or when a difference between the control voltage and the gate voltage is greater than a predetermined pull-in voltage, the elastic conductive layer may be attached to the gate region to form a channel.

The pull-in voltage and the pull-out voltage may be determined based on a physical friction force between the elastic conductive layer and the gate insulating region, and an electrical conductivity and elasticity of the elastic conductive layer. For example, the gate insulating region may include a cavity and a high-k film, and the pull-in voltage and the pull-out voltage may vary according to a dielectric constant of a material used to form the gate insulating region. For example, the pull-in voltage and the pull-out voltage may be determined based on a physical friction force between the elastic conductive layer and the gate insulating region, and an electrical conductivity and elasticity of the elastic conductive layer.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

DETAILED DESCRIPTION

Figure 1:
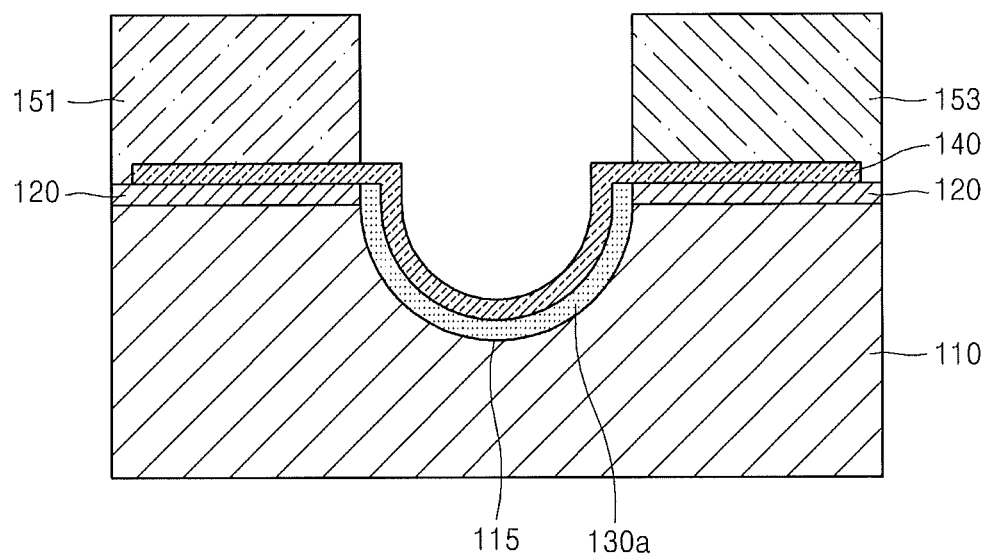
FIG. 1 is a cross-sectional view of a transistor with an elastic channel, according to some embodiments of the present inventive concept.

The present inventive concept now will be described more fully hereinafter with reference to the accompanying drawings, in which embodiments of the inventive concept are shown. However, this inventive concept should not be construed as limited to the embodiments set forth herein. Rather, these embodiments are provided so that this disclosure will be thorough and complete, and will fully convey the scope of the inventive concept to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concept. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. The present inventive concept will now be described more fully hereinafter with reference to the accompanying drawings, in which preferred embodiments of the inventive concept are shown. This inventive concept, however, may be embodied in many different forms and should not be construed as limited to the embodiments set forth herein. Rather, these embodiments are provided so that this disclosure will be thorough and complete, and will fully convey the scope of the inventive concept to those skilled in the art.

It should be construed that forgoing general illustrations and following detailed descriptions are exemplified and an additional explanation of claimed inventive concepts is provided.

Reference numerals are indicated in detail in some embodiments of the present inventive concept, and their examples are represented in reference drawings. Throughout the drawings, like reference numerals are used for referring to the same or similar elements in the description and drawings.

FIG. 1 is a cross-sectional view of a transistor with an elastic channel 100a according to some embodiments of the present inventive concept. Hereinafter, the transistor 100a with an elastic channel will be referred to as elastic channel transistor 100a, for convenience of description.

Referring to FIG. 1, the elastic channel transistor 100a may include a gate region 110, an insulating layer 120, a gate insulating region 130a, an elastic conductive layer 140, a first electrode 151, and a second electrode 153.

The gate region 110 may include impurity-doped silicon, a metal, and/or a metal compound. For example, the gate region 110 may be formed of tungsten (W), titanium (Ti), aluminum (Al), tantalum (Ta), tungsten nitride ($WN_x$), aluminum nitride ($AlN_x$), titanium nitride ($TiN_x$), tungsten silicide ($WSi_x$), titanium silicide ($TiSi_x$), cobalt silicide ($CoSi_x$), or the like. These materials may be used alone or as a mixture. The gate region 110 may have a single-layer structure including a silicon film, a metal film, or a metal compound film, or a multi-layer structure including a silicon film, a metal film, and/or a metal compound film. The gate region 110 may have a first area 115 having a round cross-sectional shape that is inwardly curved.

The insulating layer 120 may be disposed on portions of a top surface of the gate region 110 corresponding to both side end portions of the first area 115. The insulating layer 120 may be formed of silicon oxide ($Si_xO_y$), hafnium oxide ($HfO_x$), aluminum oxide ($AlO_x$), zirconium oxide ($ZrO_x$), tantalum oxide ($TaO_x$), or the like.

The gate insulating region 130a is formed on the first area 115a of the gate region 110. The gate insulating region 130a prevents the gate region 110 from being electrically connected to the elastic conductive layer 140, and may include silicon oxide ($Si_xO_y$), aluminum oxide ($Al_xO_y$), hafnium oxide ($Hf_xO_y$), zirconium oxide ($Zr_xO_y$), yttrium oxide ($Y_xO_y$), lanthanum oxide ($La_xO_y$), tantalum oxide ($Ta_xO_y$), praseodymium oxide ($Pr_xO_y$), and titanium oxide ($Ti_xO_y$), aluminum silicon oxide ($Al_xSi_yO_z$), zirconium silicon oxide ($ZrSi_xO_y$), and/or hafnium silicon oxide ($HfSi_xO_y$), among others.

According to a dielectric constant of a material consisting of the gate insulating region 130a, a threshold voltage basis of formations of a channel in the elastic channel transistor 100 may be determined. Herein, a path through which charges move between a source region and a drain region of a transistor is referred to as a channel.

The elastic conductive layer 140 is disposed between the first and second electrodes 151 and 153 and the insulating layer 120. The elastic conductive layer 140 includes graphene. Graphene, which is a thin sheet of carbon atoms packed in a lattice and has a thickness of several nanometers (nm), has very high electrical conductivity because charges in graphene act as zero effective mass particles. Graphene has a current density of about 108 A/cm$^2$ that is 100 times or higher than that of copper, and has high thermal conductivity and high elasticity. Due to high electrical conductivity and high elasticity, graphene is easily applied to transparent and flexible devices. When graphene is used as a channel material, a transistor may consume low power and operate at high speeds. Since graphene has a thin film shape, graphene may be more easily deformed by an external electric field and may consume less power than cylindrical carbon nanotubes.

Since the elastic channel transistor 100a of FIG. 1 includes the elastic conductive layer 140 having high electrical conductivity, flexibility, and elasticity, whether to form a channel may be controlled based on an electrostatic force generated between the gate region 110 and the elastic conductive layer 140.

The elastic conductive layer 140 may be formed by exfoliation using single-crystal graphite. The exfoliation involves attaching the single-crystal graphite to a top surface of the insulating layer 120 and attaching part of the graphite, that is, graphene, to the insulating layer 120 by using the Van der Waals force between the single-crystal graphite and the insulating layer 120.

An operation of the elastic conductive layer 140 will be described later.

The first electrode 151 and the second electrode 153 are disposed on the insulating layer 120, are electrically connected to the elastic conductive layer 140, and contact the insulating layer 120. The first electrode 151 and the second electrode 153 may be respectively a source electrode and a drain electrode, or vice versa. The first electrode 151 and the second electrode 153 may be formed entirely on an upper portion of the insulating layer 120, and/or may be formed partially on the upper portion of the insulating layer 120. The first electrode 151 and the second electrode 153 may be spaced apart from each other with the elastic conductive layer 140 on the first area 115 therebetween. Each of the first and second electrodes 151 and 153 may include a conductive material, for example, polysilicon or indium tin oxide (ITO). Also, each of the first electrode 151 and the second electrode 153 may include a metal, for example, at least one of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), thallium (Te), titanium (Ti), tungsten (W), zinc (Zn), and/or zirconium (Zr), among others. The first electrode 151 and the second electrode 153 may be formed by chemical vapor deposition (CVD), plasma enhanced CVD (PECVD), low pressure CVD (LPCVD), physical vapor deposition (PVD), sputtering, atomic layer deposition (ALD), or the like.

Figure 2:
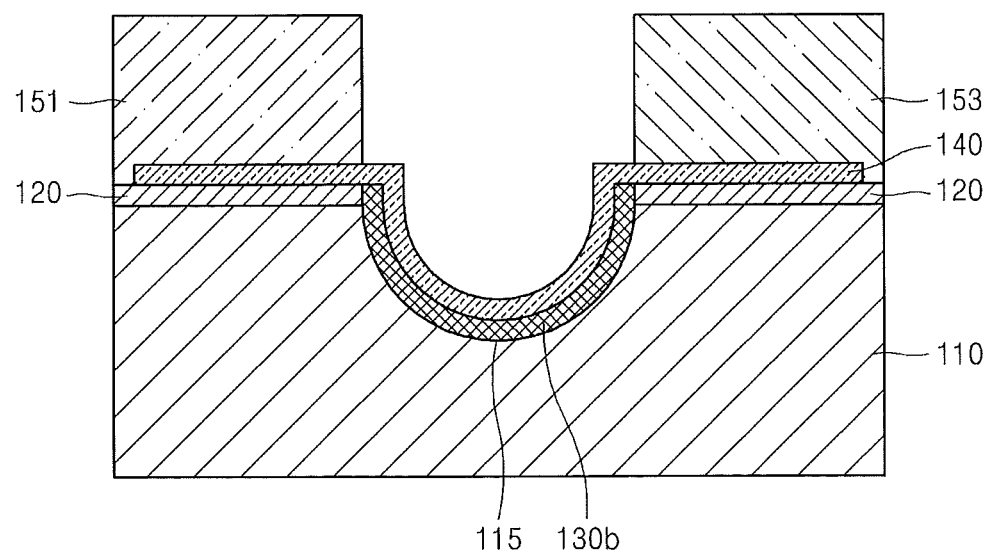
FIG. 2 is a cross-sectional view of a transistor with an elastic channel, according to some embodiments of the present inventive concept.

FIG. 2 is a cross-sectional view of a transistor 100b with an elastic channel, according to some embodiments of the present inventive concept. Hereinafter, the transistor 100b with an elastic channel will be referred to as elastic channel transistor 100b, for convenience of description.

The same elements as those in FIG. 1 are denoted by the same reference numerals, and thus a detailed explanation thereof will be omitted.

Referring to FIG. 2, the elastic channel transistor 100b may include the gate region 110, the insulating layer 120, a gate insulating region 130b, the elastic conductive layer 140, and the first and second electrodes 151 and 153.

Except the gate insulating region 130b, the configuration of the elastic channel transistor 100b of FIG. 2 is substantially the same as a configuration of the elastic channel transistor 100a of FIG. 1.

The gate insulating region 130b may be a cavity formed between the elastic conductive layer 140 and the gate region 110. After the insulating layer 120 and the elastic conductive layer 140 are formed on the gate region 110, the gate insulating region 130b may be formed by selectively removing a material filled in a would-be gate insulating region formed on the first area 115 to form a cavity between the elastic conductive layer 140 and the gate region 110. For example, the material filled in the would-be gate insulating region may be removed by wet etching.

When the gate insulating region 130a is a cavity, even though the elastic conductive layer 140 is deformed by an electrostatic force between the elastic conductive layer 140 and the gate region 110 during operation, the elastic conductive layer 140 is not fatigued or worn out because the elastic conductive layer 140 does not physically contact the gate region 110 or the like, and there is no risk that the elastic conductive layer 140 may react with a material used to form the gate insulating region 130a. Also, since the elastic conductive layer 140 is not worn out even though the elastic conductive layer 140 is deformed during operation, the lifetime of the elastic channel transistor 100b may be extended.

A threshold voltage of the elastic channel transistor 100a or 100b may be determined by a dielectric constant of the gate insulating region 130a or 130b. For example, when the gate insulating region 130b is a cavity, a threshold voltage may be higher than a threshold voltage in a case where the gate insulating region 130a is filled with a specific material.

Figure 3:
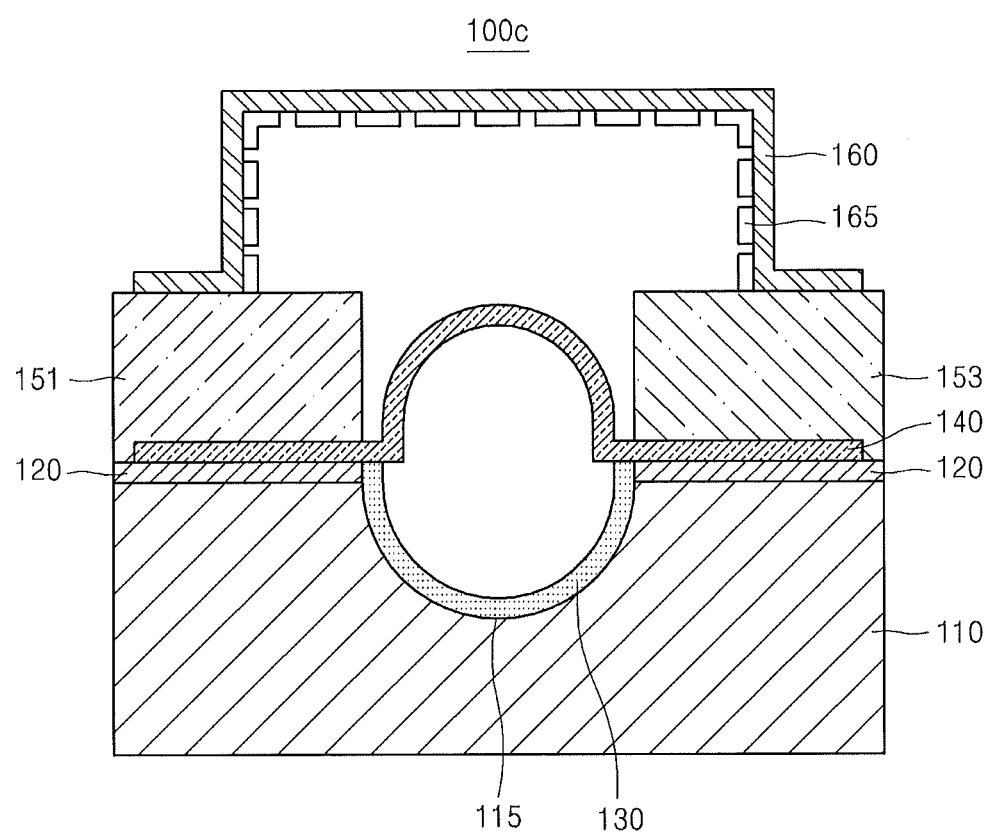
FIG. 3 is a cross-sectional view of a transistor with an elastic channel, according to some embodiments of the present inventive concept.

FIG. 3 is a cross-sectional view illustrating a transistor 100c with an elastic channel, according to some embodiments of the present inventive concept. Hereinafter, the transistor 100c with an elastic channel will be referred to as elastic channel transistor 100c, for convenience of description.

The same elements as those in FIG. 1 or 2 are denoted by the same reference numerals, and thus a detailed explanation thereof will be omitted.

Referring to FIG. 3, the elastic channel transistor 100c may include the gate region 110, the insulating layer 120, a gate insulating region 130, the elastic conductive layer 140, the first and second electrodes 151 and 153, a support structure 160, and a porous film 165.

Compared with the elastic channel transistors 100a and 100b of FIGS. 1 and 2, the elastic channel transistor 100c of FIG. 3 may further include the support structure 160 and a porous film 165.

A cavity is formed between the elastic conductive layer 140 and the support structure 160 in order to prevent the elastic conductive layer 140 from being deformed due to its varying shape based on voltages applied to the first electrode 151, the second electrode 153, and the gate region 110. For example, when the elastic conductive layer 140 is spaced apart from the gate region 110, the elastic conductive layer 140 may have a height that is the same as or greater than a height of each of the first and second electrodes 151 and 153.

The porous film 165 is formed in order to form the support structure 160 in a processing step.

In FIG. 3, the gate insulating region 130 may include silicon oxide ($Si_xO_y$), aluminum oxide ($Al_xO_y$), hafnium oxide ($Hf_xO_y$), zirconium oxide ($Zr_xO_y$), yttrium oxide ($Y_xO_y$), lanthanum oxide ($La_xO_y$), tantalum oxide ($Ta_xO_y$), praseodymium oxide ($Pr_xO_y$), titanium oxide ($Ti_xO_y$), aluminum silicon oxide ($Al_xSi_yO_z$), zirconium silicon oxide ($Zr-Si_xO_y$), and/or hafnium silicon oxide ($HfSi_xO_y$), and a cavity.

Figure 4:
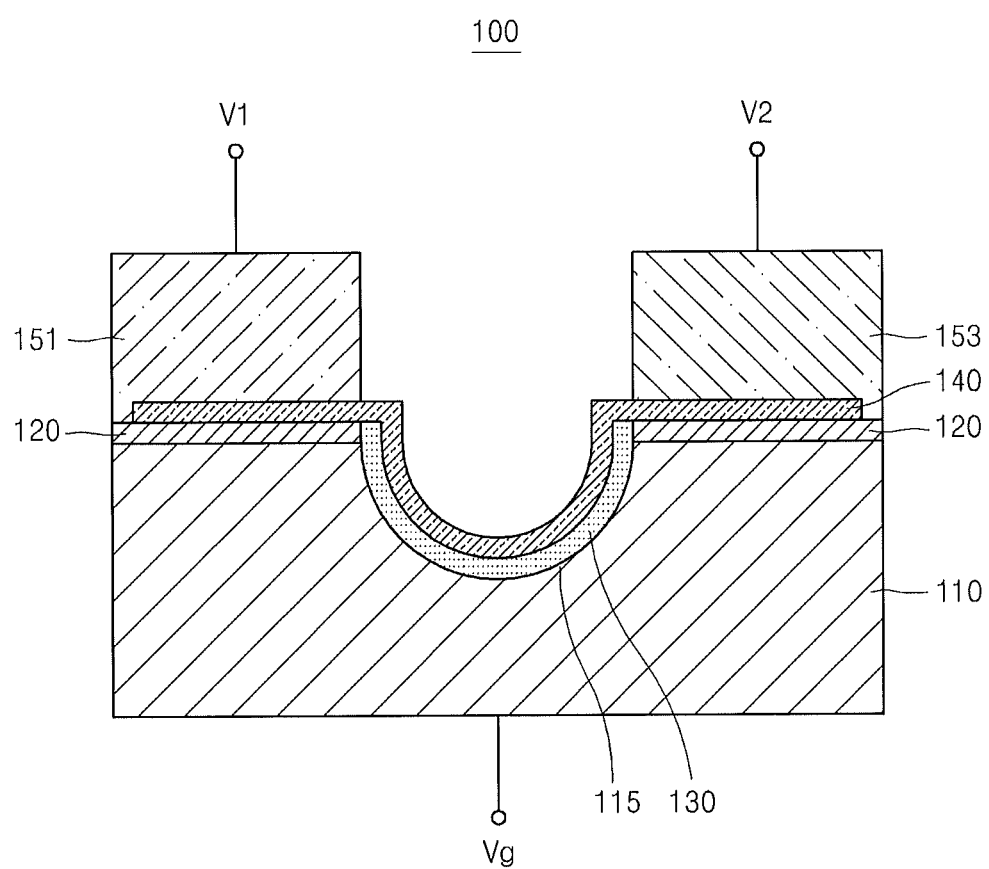
FIG. 4 is a cross-sectional view for describing an operation of a transistor with an elastic channel, according to some embodiments of the present inventive concept.

FIG. 4 is a cross-sectional view for describing an operation of a transistor 100 with an elastic channel, according to some embodiments of the present inventive concept. Hereinafter, the transistor 100 with an elastic channel will be referred to as elastic channel transistor 100, for convenience of description.

Referring to FIG. 4, a first voltage V1 may be applied to the first electrode 151 of the elastic channel transistor 100, a second voltage V2 may be applied to the second electrode 153 of the elastic channel transistor 100, and a gate voltage Vg may be applied to the gate region 110 of the elastic channel transistor 100.

For example, the elastic channel transistor 100 may operate in a setting step and an operating step. In the setting step, the elastic channel transistor 100 is set to have a first state or a second state based on the first voltage V1 or the second voltage V2 and the gate voltage Vg.

In the setting step, for example, the first voltage V1 may correspond to a first control voltage CON1, and the gate voltage Vg may correspond to a second control voltage CON2. Due to the first control voltage CON1, the elastic conductive layer 140 may be charged to substantially the same polarity as a polarity of the first control voltage CON1, and the second electrode 153 may be in a floating state.

The first control voltage CON1 and the second control voltage CON2 may have substantially the same polarity. For example, when the first control voltage CON1 is a positive voltage, the second control voltage CON2 may be a positive voltage, and when the first control voltage CON1 is a negative voltage, the second control voltage CON2 may be a negative voltage. When the first control voltage CON1 and the second control voltage CON2 have substantially the same polarity as described above, since polarities of charges generated in the elastic conductive layer 140 and the gate region 110 are the same, a repulsive force acts between the elastic conductive layer 140 and the gate region 110. In order to generate such a repulsive force, a sum of the second control voltage CON2 and the first control voltage CON1 should be equal to or greater than a predetermined pull-out voltage Vpo. The pull-out voltage Vpo may be determined based on a physical friction force between the elastic conductive layer 140 and the gate insulating region 130, the electrical conductivity of the elastic conductive layer 140, the elasticity of the elastic conductive layer 140, and so on.

When the first voltage V1 corresponds to the first control voltage CON1, the second voltage V2 may be a voltage that does not change a polarity of the elastic conductive layer 140 charged by the first control voltage CON1. For example, the second voltage V2 may be a ground voltage GND, or may be in a floating state if necessary.

When a repulsive force acts between the elastic conductive layer 140 and the gate region 110, as shown in FIG. 4, the elastic conductive layer 140 may be spaced apart from the gate insulating region 130 to form a cavity between the elastic conductive layer 140 and the gate insulating region 130, or when the gate insulating region 130 is a cavity, the size of the cavity may be increased. A state where the elastic conductive layer 140 and the gate region 110 are spaced apart from each other by a predetermined distance is referred to as a second state. When the elastic channel transistor 100 is in the second state, even though a predetermined voltage is applied to the gate region 110, a channel is not formed in the elastic conductive layer 140 and thus electrons do not move through the elastic conductive layer 140.

In the setting step, the first control voltage CON1 and the second control voltage CON2 may be set to have polarities substantially opposite to each other. For example, when the first control voltage CON1 is a positive voltage, the second control voltage CON2 may be a negative voltage, and when the first control voltage CON1 is a negative voltage, the second control voltage CON2 may be a positive voltage. When the first control voltage CON1 and the second control voltage CON2 have substantially opposite polarities as described above, an attractive force acts between the gate region 110 and the elastic conductive layer 140 charged by the first control voltage CON1. In order to generate such an attractive force, a difference between the second control voltage CON2 and the first control voltage CON1 should be greater than or equal to a preset pull-in voltage Vpi. The pull-in voltage Vpi may be determined based on a physical friction force between the elastic conductive layer 140 and the gate insulating region 130, the electrical conductivity of the elastic conductive layer 140, the elasticity of the elastic conductive layer 140, and so on. Likewise, when the first voltage V1 corresponds to the first control voltage CON1, the second voltage V2 may be a voltage that does not change a polarity of the elastic conductive layer 140 charged by the first control voltage CON1. For example, the second voltage V2 may be a ground voltage GND, or may be in a floating state if necessary.

A state where an attractive force is generated between the elastic conductive layer 140 and the gate region 110 and thus the elastic conductive layer 140 and the gate insulating region 130 become closer to each other is referred to as a first state. The elastic channel transistor 100 in the first state may have substantially the same configuration as any of the elastic channel transistors 100a, 100b, and 100c illustrated in FIGS. 1 through 3. When the elastic channel transistor 100 of FIG. 4 is in the first state, a channel may be formed in the elastic conductive layer 140 due to the gate voltage Vg, and the elastic channel transistor 100 may operate as a transistor.

Accordingly, the elastic channel transistor 100 of FIG. 4 may be set to have the first state or the second state based on the first and second control voltages CON1 and CON2. However, the above mentioned description has been made on the assumption that the gate region 110 is doped with predetermined impurities, and a polarity of a voltage for setting the elastic channel transistor to the first state or the second state is not limited thereto.

When no voltage is applied to the elastic channel transistor 100, for example, when the first voltage V1, the second voltage V2, and the gate voltage Vg are not applied, the elastic channel transistor 100 maintains its previous shape of the elastic conductive layer 140 due to the elasticity. Here, to maintain the previous shape represents that a shape that the elastic conductive layer 140 of the elastic channel transistor 100 is maintained. The elastic channel transistor having the first state or the second state in the setting step or the operating step may maintain the same shape even though no voltage is applied to the elastic channel transistor 100.

In the operating step, the elastic channel transistor 100 performs an operation that varies according to whether the elastic channel transistor 100 is set to have the first state or the second state in the setting step. The elastic channel transistor 100 in the first state may operate as a transistor and transfer a voltage of the first electrode 151 to the second electrode 153 in response to the gate voltage Vg. On the other hand, the elastic channel transistor 100 in the second state may not transfer charges, and may be in substantially the same state as an open state of a circuit.

FIGS. 5A through 5J are cross-sectional views for describing methods of manufacturing an elastic channel transistor, according to some embodiments of the present inventive concept.

Figure 5A:
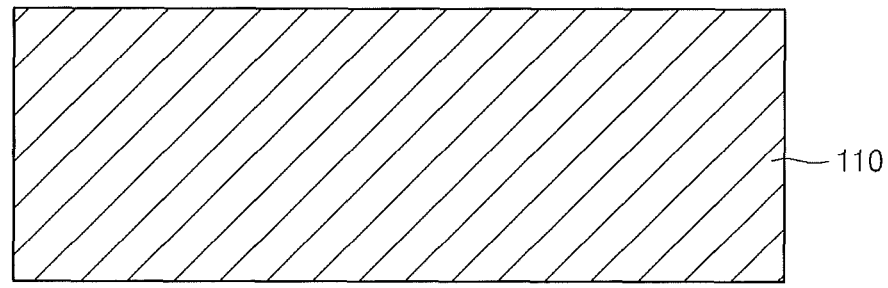
FIGS. 5A through 5J are cross-sectional views for describing a method of manufacturing a transistor with an elastic channel, according to some embodiments of the present inventive concept.

Referring to FIG. 5A, the gate region 110 is provided. The gate region 110 may be formed by CVD, PECVD, LPCVD, PVD, sputtering, ALD, or the like. The gate region 110 may be formed of impurity-doped silicon.

Figure 5B:
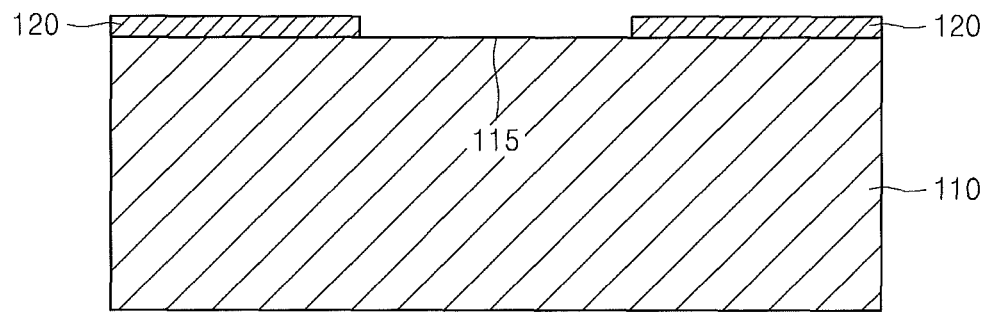

Referring to FIG. 5B, the insulating layer 120 is formed on the gate region 110. The insulating layer 120 may be formed by being patterned on an area of a top surface of the gate region 110 other than the first area 115, and may include, for example, silicon oxide, silicon nitride, or silicon oxy-nitride.

Figure 5C:
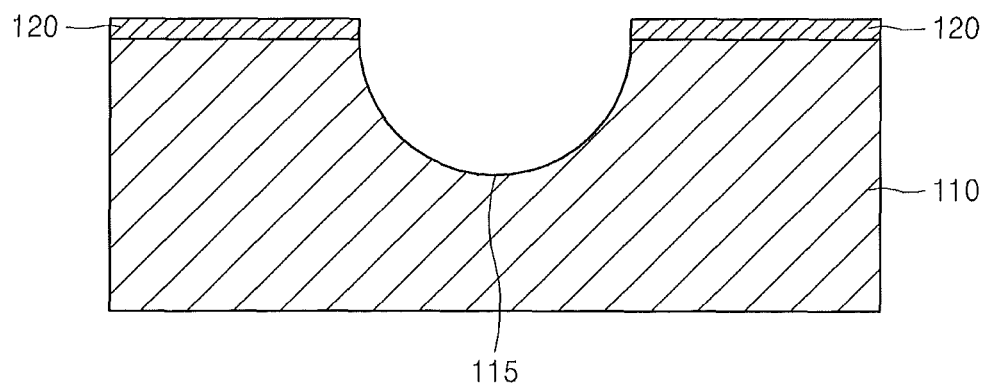

Referring to FIG. 5C, the first area 115 of the gate region 110 is formed by etching. The first area 115 may be formed to have a round cross-sectional shape that is inwardly curved, and the first area 115 may be formed by isotropic etching. For example, HNA that is a mixture of a hydrofluoric acid, an acetic acid, and a nitric acid may be used as a solvent of the isotropic etching. The first area 115 may be formed to have a shape that varies according to an etch selectivity and an etching method. In a micro-fabrication process, the first area 115 may be formed to have a shape that is closer to a circle by shaking a fluid in an etching step.

Figure 5D:
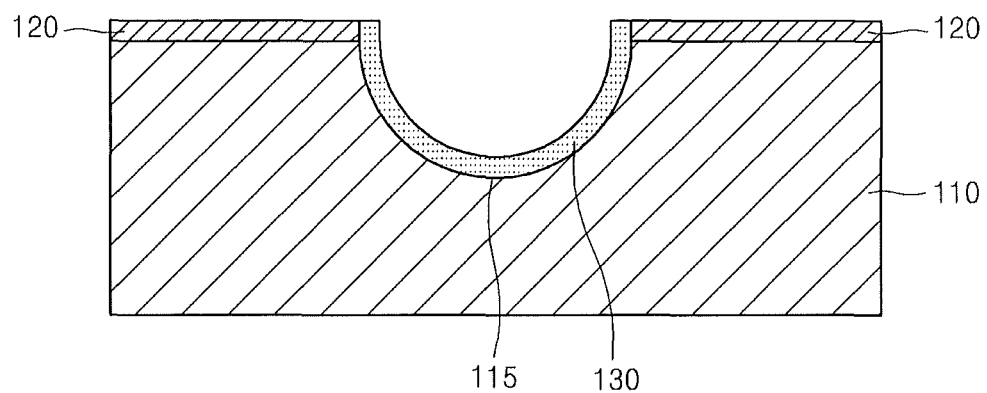

Referring to FIG. 5D, the gate insulating region 130 is formed on the first area 115 of the gate region 110. The gate insulating region 130 may have substantially the same shape as a shape of the first area 115.

The gate insulating region 130 may include, for example, silicon oxide, silicon nitride, or silicon oxy-nitride. The gate insulating region 130 may be a multi-layer including a silicon oxide layer and a silicon nitride layer, or may be a silicon oxide layer having a part that is nitrified. The nitriding may be performed by annealing using a nitrogen-containing gas, for example, an $NH_3$ gas, rapid thermal annealing (RTA), laser RTA, or the like. Alternatively, the nitriding may be performed by plasma nitriding, plasma ion implantation, PECVD, high density plasma CVD (HDP-CVD), or radical nitriding. After the nitriding, a resultant structure may be thermally treated in an inert atmosphere containing an inert gas such as helium or argon.

Figure 5E:
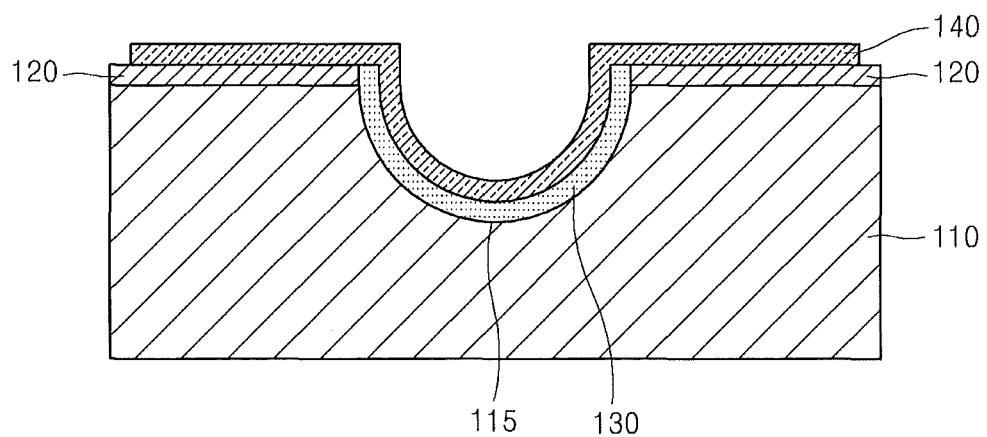

Referring to FIG. 5E, the elastic conductive layer 140 is formed on the insulating layer 120 and the gate insulating region 130. The insulating layer 120 may have adhesiveness to graphene, and the elastic conductive layer 140 may be formed on the insulating layer 120 by detaching graphite due to a mechanical and/or electrostatic Van der Waals force.

The elastic conductive layer 140 may be formed over the gate region 110, and may have substantially the same shape as a shape of the first area 115 of the gate region 110.

Figure 5F:
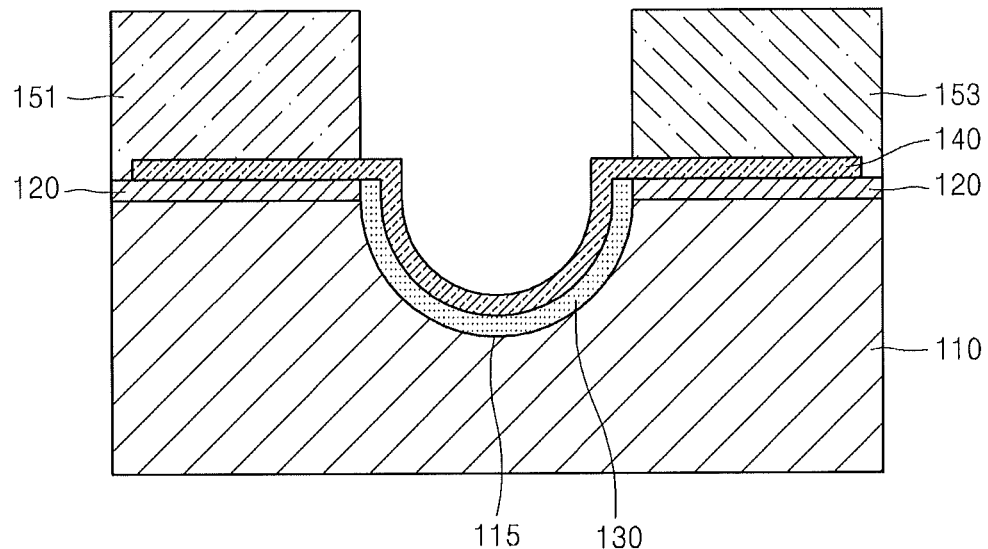

Referring to FIG. 5F, the first electrode 151 and the second electrode 153 are formed on portions of a top surface of the insulating layer 120 corresponding to both side end portions of the first area 115. Each of the first electrode 151 and the second electrode 153 may include a conductive material, for example, polysilicon or ITO. Each of the first electrode 151 and the second electrode 153 may include a metal, for example, at least one of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), thallium (Te), titanium (Ti), tungsten (W), zinc (Zn), and/or zirconium (Zr). The first electrode 151 and the second electrode 153 may be formed by a deposition process such as CVD, PECVD, LPCVD, PVD, sputtering, or ALD.

Figure 5G:
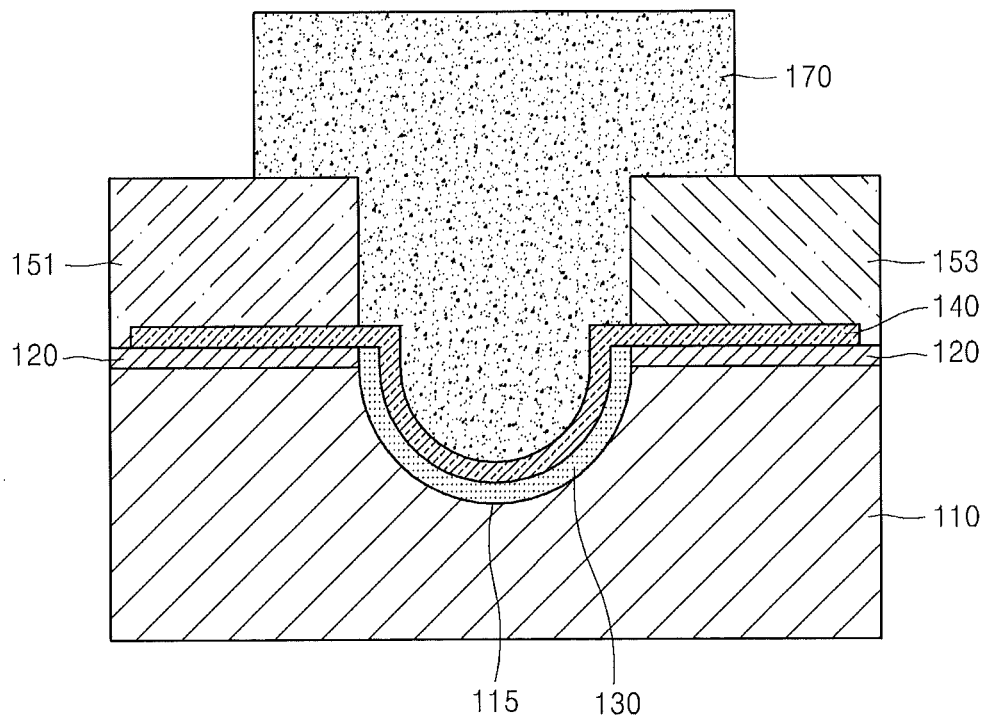

Referring to FIG. 5G, a sacrificial layer 170 is deposited, and is patterned to form a cavity over the elastic conductive layer 140. When the elastic conductive layer 140 is spaced apart from the gate insulating region 130 so as not to form a channel, the sacrificial layer 170 may have a height great enough to have a sufficient space that may protect the shape of the elastic conductive layer 140. Since the support structure 160 is to be formed on the sacrificial layer 170, the sacrificial layer 170 may be patterned in substantially the same shape as that of the cavity formed under the support structure 160. For example, the sacrificial layer 170 may be partially formed on the first electrode 151 and the second electrode 153.

Figure 5H:
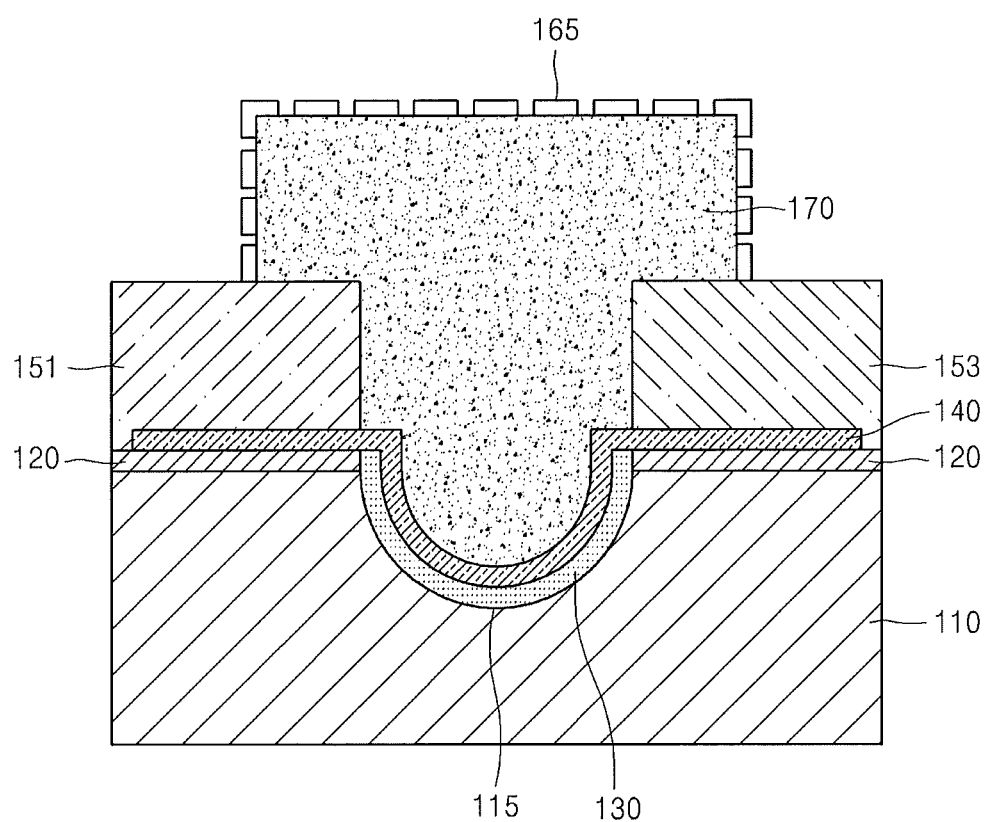

Referring to FIG. 5H, the porous film 165 is formed on the sacrificial layer 170. Examples of the porous film 165 may include a macropore porous film, a mesopore porous film, and a nanopore porous film according to the size of a hole of the porous film 165.

Figure 5I:
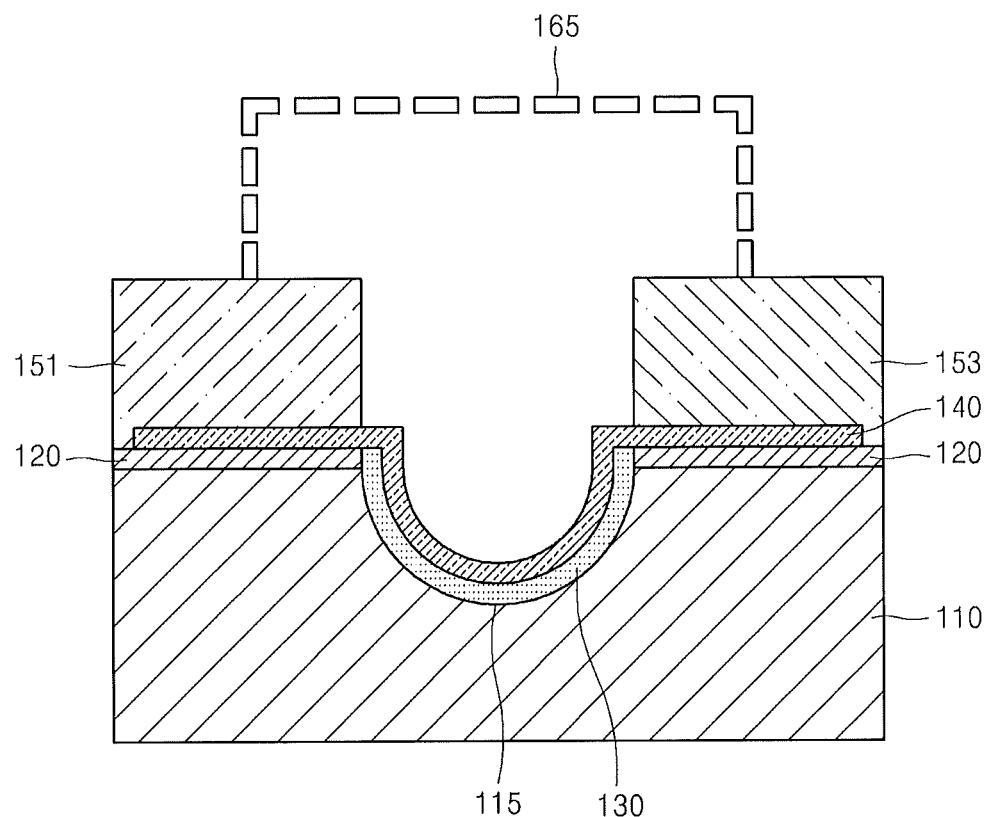

Referring to FIG. 5I, the sacrificial layer 170 is removed by wet etching. A solvent used in the wet etching may remove the sacrificial layer 170 by passing through the porous film 165, and may also remove a film in the gate insulating region 130. The solvent used in the wet etching should have high selectivity at which the film is removed from the gate insulating region 130.

When the film on the gate insulating region 130 is removed, the elastic channel transistor may have such a configuration as shown in FIG. 2, and when the film on the gate insulating region 130 is not removed, the elastic channel transistor may have such a configuration as shown in FIG. 1.

Figure 5J:
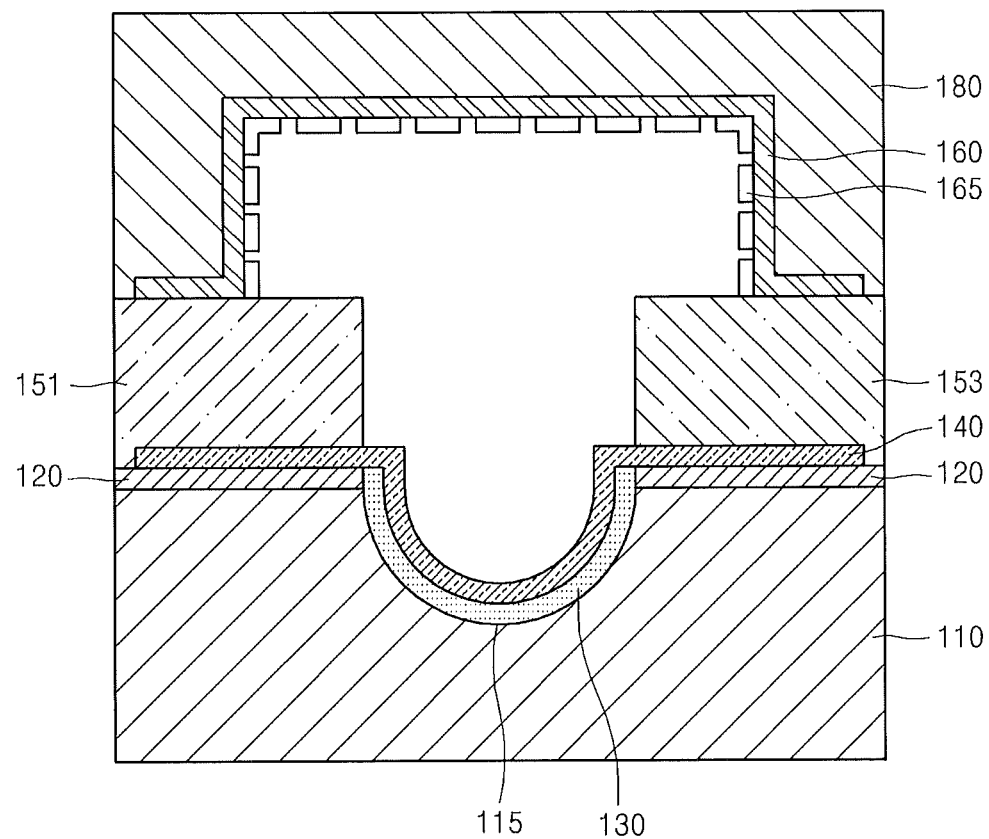

Referring to FIG. 5J, the support structure 160 is formed on the porous film 165. A cavity is formed over the elastic conductive layer 140 so that the elastic channel transistor 100 may be able to have the first state or the second state due to the elasticity of the elastic conductive layer 140. The support structure 160 may be formed of an insulating material or a conductive material. A dielectric layer may be formed on the support structure 160.

The elastic channel transistor of FIGS. 5A through 5J may be formed by a microelectromechanical system (MEMS) or nanoelectromechanical system (NEMS) process.

Figure 6A:
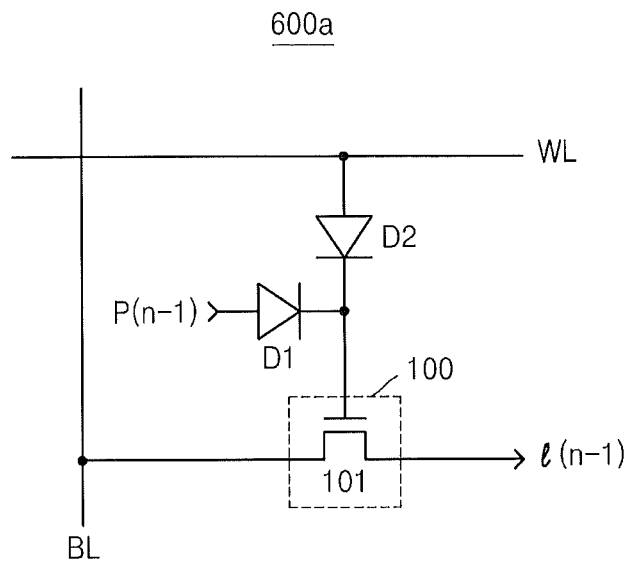
FIGS. 6A and 6B are circuit diagrams of transistor units with elastic channels, according to some embodiments of the present inventive concept.
Figure 6B:
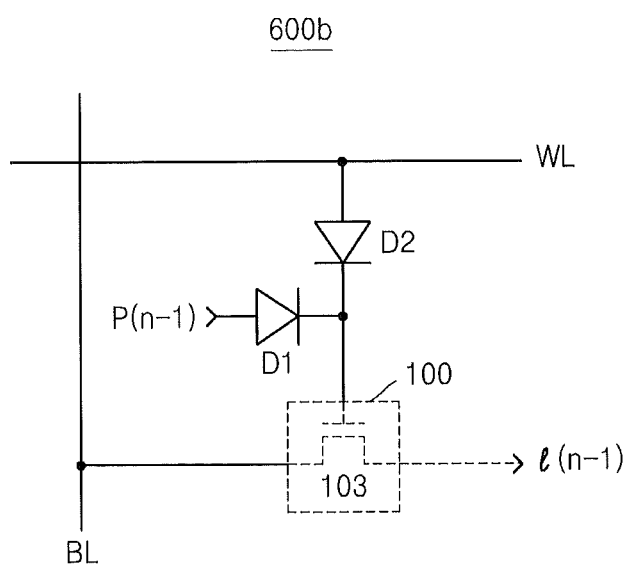

FIGS. 6A and 6B are circuit diagrams of transistor units 600a and 600b with elastic channels, according to some example embodiments. Hereinafter, the transistor units 600a and 600b with elastic channels will be referred to as elastic channel transistor units 600a and 600b, for convenience of description.

Referring to FIGS. 6A and 6B, each of the elastic channel transistor units 600a and 600b may include a word line WL extending in a first direction, a bit line BL extending in a second direction different from the first direction, the elastic channel transistor 100 electrically connected to the word line WL and the bit line BL, and first and second diodes D1 and D2 connected to the elastic channel transistor 100.

FIGS. 6A and 6B illustrate a part of each of the elastic channel transistor units 600a and 600b including one elastic channel transistor 100. A semiconductor device may be configured to include a plurality of elastic channel transistor units that are arrayed.

A first state elastic channel transistor 101 illustrated in FIG. 6A is the elastic channel transistor 100 set to have the first state, and a second state elastic channel transistor 103 illustrated in FIG. 6B is the elastic channel transistor 100 set to have the second state. The elastic channel transistor 100 may include the first state and second state elastic channel transistors 101 and 103.

As described above with reference to FIG. 3, whether to form a channel is determined based on the location of the elastic conductive layer 140 included in the elastic channel transistor 100, for example, a distance between the elastic conductive layer 140 and the gate region 110, the first state elastic channel transistor 101 is illustrated as a transistor, and the second state elastic channel transistor 103 is marked by a dash line and operates in the same manner as that in an open state.

The first diode D1 is connected between the word line WL and the gate region 110 of the elastic channel transistor 100, and a first terminal of the second diode D2 is connected to the gate region 110 of the elastic channel transistor 100 and a second terminal of the second diode D2 may receive a path signal p(n−1). The path signal p(n−1) may be a value corresponding to a logic state 'high' or a logic state 'low'. For example, the path signal p(n−1) may be an output signal of a logic element.

When the path signal p(n−1) corresponds to a logic state 'high', the first diode D1 provides the path signal p(n−1) to the gate region 110 of the elastic channel transistor 100. Also, when the word line WL is activated, for example, when a voltage corresponding to a logic state 'high' is applied to the word line WL, the gate region 110 may receive a word line voltage applied to the word line WL.

An operation of the elastic channel transistor 100 in the operating step will now be described in detail with reference to FIGS. 6A and 6B.

In the operating step, the first control voltage CON1 may correspond to a bit line voltage, and the second control voltage CON2 may correspond to a word line voltage. The bit line voltage may correspond to a power supply voltage VSS, and the power supply voltage VSS may correspond to a logic state 'high'. Also, the second control voltage CON2 may be a ground voltage GND or may be in a floating state. Accordingly, the first and second control voltages CON1 and CON2 applied to set the elastic channel transistor 100 to have the first state or the second state in the setting step maintain their predetermined values in the operating step. However, values of the first and second voltages CON1 and CON2 may not be limited thereto.

Referring to FIG. 6A, in the operating step, the first state elastic channel transistor 101 provides a bit line voltage as a logic signal l(n−1) in response to the path signal p(n−1). For example, since the first state elastic channel transistor 101 provides the bit line voltage as the logic signal l(n−1) in response to the path signal p(n−1) that corresponds to a logic state 'high', it may be substantially the same as a case where the path signal p(n−1) is provided as the logic signal l(n−1).

Referring to FIG. 6B, since the second state elastic channel transistor 103 is in substantially the same condition as an open circuit in the operating step, a bit line voltage is not provided as the logic signal l(n−1) irrespective of the path signal p(n−1), and the logic signal l(n−1) has a value in a floating state.

Each of the path signal p(n−1) and the logic signal l(n−1) may be a voltage corresponding to a logic state 'high' or a logic state 'low'.

Accordingly, a semiconductor device including the elastic channel transistor 100 of FIGS. 6A and 6B may perform an operation that varies according to a state of a channel set in the setting step.

Figure 7A:
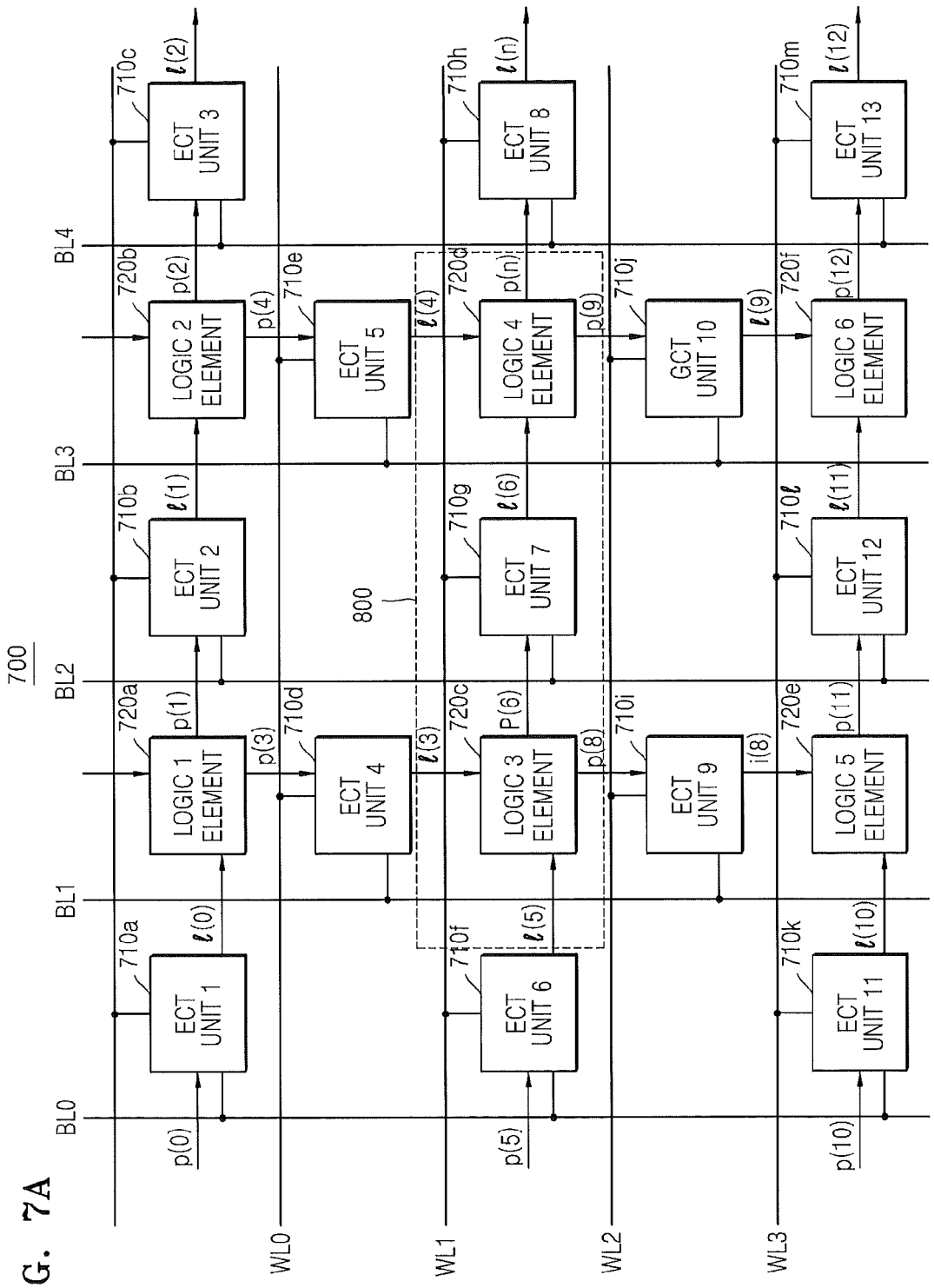
FIG. 7A is a block diagram of a semiconductor device according to some embodiments of the present inventive concept.

FIG. 7A is a block diagram of a semiconductor device 700 according to some embodiments of the present inventive concept.

Referring to FIG. 7A, the semiconductor device 700 includes a plurality of word lines WL, a plurality of bit lines BL, a plurality of elastic channel transistor units 710a, 710b, . . . and 710m, and a plurality of logic elements 720a, 720b, . . . , 720f. Each of a plurality of the elastic channel transistors 100 included in the elastic channel transistor units 710a, 710b, . . . , 710m may be set to have the first state or second state elastic channel transistor 101 or 103 in the setting step. For example, when the elastic channel transistor 100 included in the fourth elastic channel transistor unit 710d is set to have the first state, a positive voltage may be applied to the first word line WL0, and a ground voltage GND or a negative voltage may be applied to the second bit line BL2. While the fourth elastic channel transistor unit 710d is set, a ground voltage GND may be provided to the second through fourth word lines WL1, WL2, and WL3. Whether each of the elastic channel transistor units 710a, 710b, ..., 710m includes the first state elastic channel transistor 101 or the second state elastic channel transistor 103 may be determined by applying voltages to the word lines WL and the bit lines BL in the setting step. Accordingly, the semiconductor device 700 of FIG. 7A may be set to have a circuit configuration that varies by adjusting voltages applied to the word lines WL and the bit lines BL in the setting step.

In the operating step, the semiconductor device 700 operates based on the circuit configuration determined in the setting step.

Each of the plurality of logic elements 720a, 720b, ..., and 720f receives two logic signals from each of the elastic channel transistor units 710a, 710b, ..., 710m and outputs two path signals. However, when an elastic channel transistor unit for providing logic signals in the setting step includes the second state elastic channel transistor 103, no logic signal may be output, and one logic signal may be received according to a state of connected logic elements.

For example, the third logic element 720c may receive a fourth logic signal l(3) and a sixth logic signal l(5) from the fourth and sixth elastic channel transistor units 710d and 710f, and output sixth and eighth path signals p(5) and p(7). However, when in the setting step, the fourth elastic channel transistor unit 710d may be set to have the first state elastic channel transistor 101, and the sixth elastic channel transistor unit 710f may be set to have the second state elastic channel transistor 103, the third logic element 720c may receive only the fourth logic signal l(3).

In the semiconductor device 700 of FIG. 7A, different signals may be received by logic signals according to states of elastic channel transistor units set in the setting step and different combinations of logic elements may be formed based on the states of the elastic channel transistor units, thereby performing different logical operations.

Figure 7B:
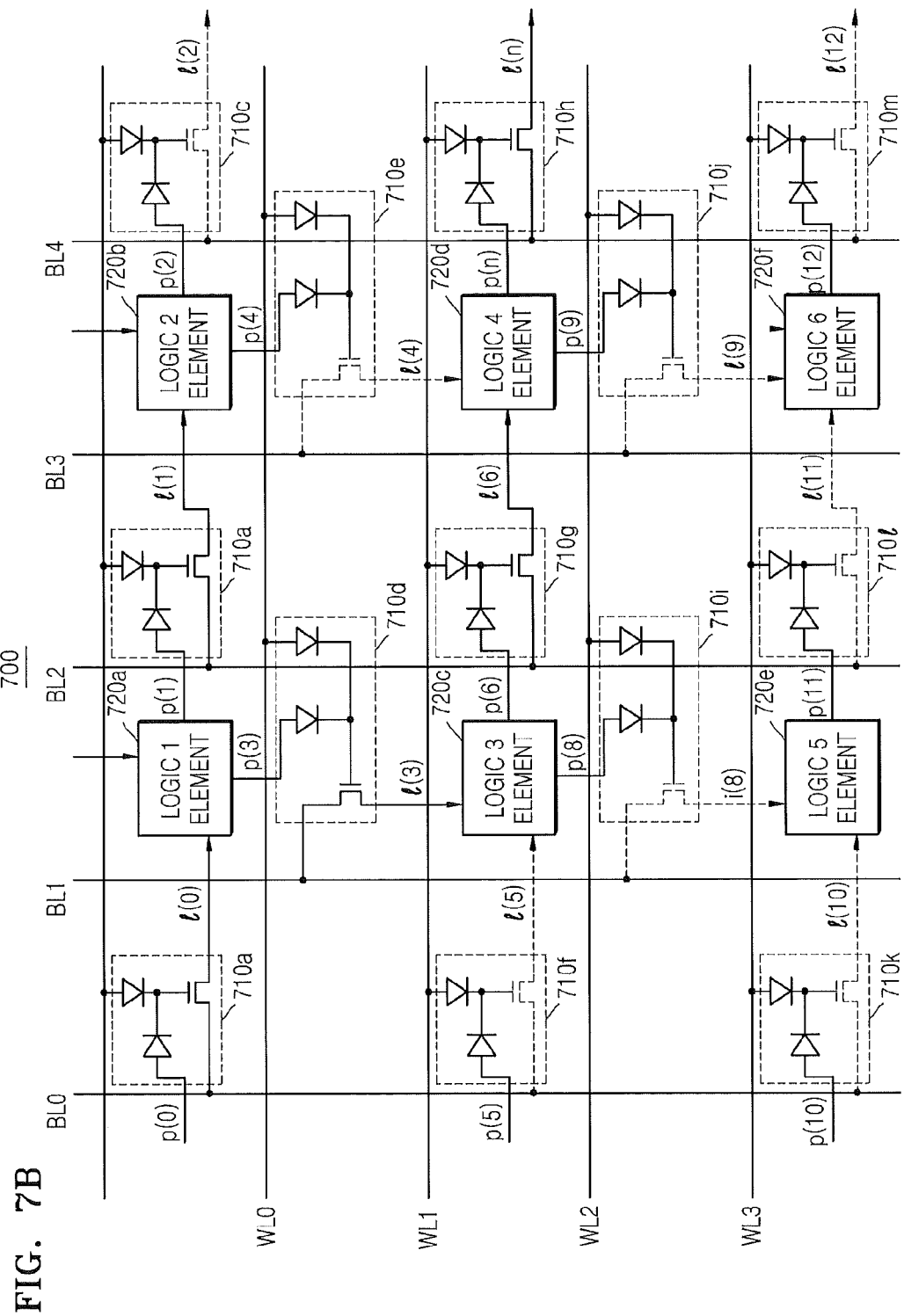
FIG. 7B is a circuit diagram of the semiconductor device of FIG. 7A.

FIG. 7B is a circuit diagram of the semiconductor device 700 of FIG. 7A.

Referring to FIG. 7B, each of the first, fourth, seventh, and eighth elastic channel transistor units 710a, 710d, 710g, and 710h may include the first state elastic channel transistor 101, and each of the second, third, fifth, sixth, and ninth through thirteenth elastic channel transistor units 710b, 710c, 710e, 710f, 710i, ..., and 710m may include the second state elastic channel transistor 103.

As shown in FIG. 7B, a logical operation is performed on a first path signal p(0) by combining inputs of the first, third, and fourth logic elements 720, 720c, and 720d to provide an eighth logic signal l(7).

When the elastic channel transistors included in the elastic channel transistor units 710a, 710b, ..., and 710m are set to have different states, different outputs may be provided, and different logical operations may be performed on an input signal. Accordingly, the semiconductor device 700 of FIG. 7B may have different circuit configurations according to states of elastic channel transistor units set in the setting step, and perform different operations.

A structure of the semiconductor device 700 of FIGS. 7A and 7B will now be described herein below.

Figure 8:
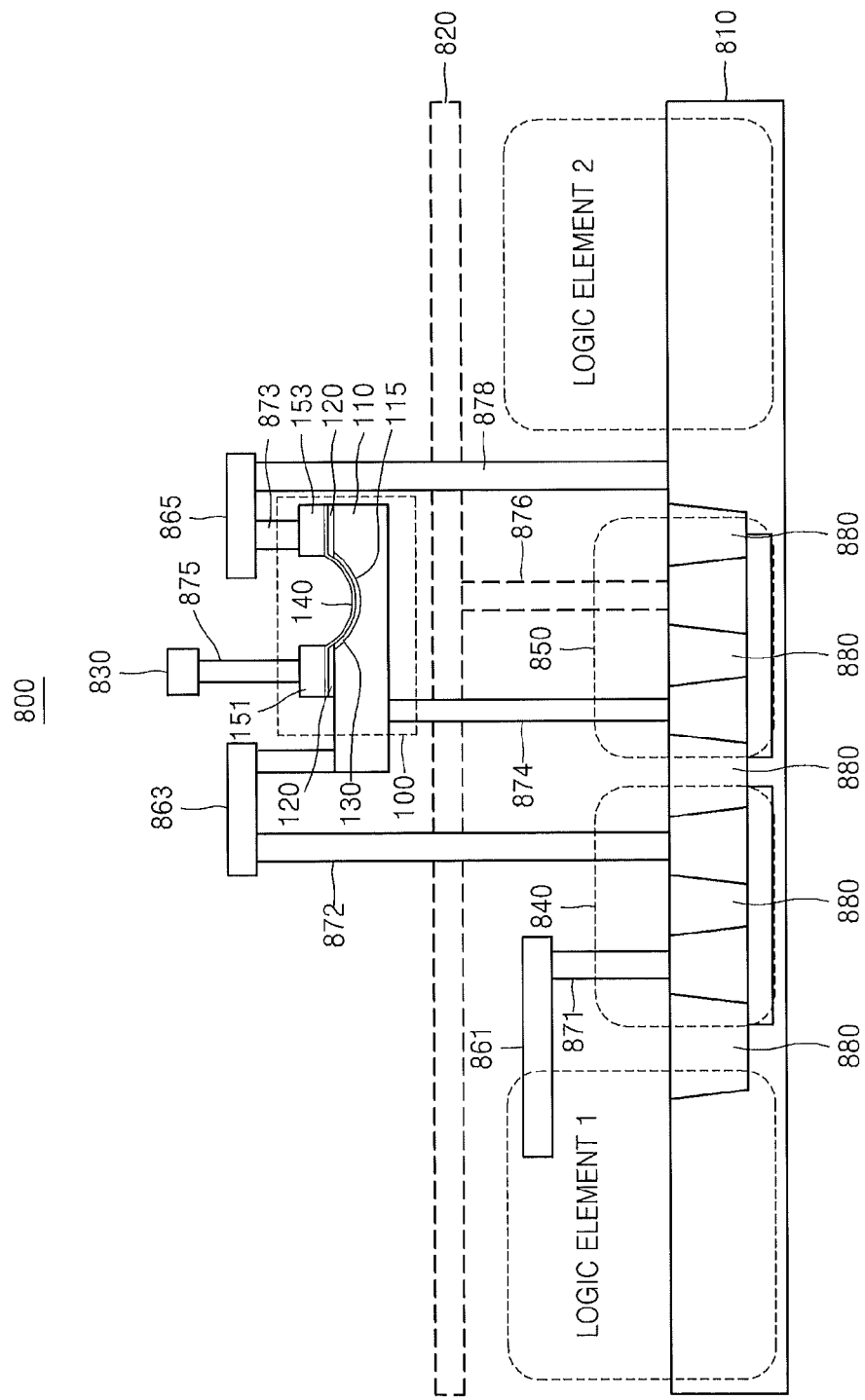
FIG. 8 is a cross-sectional view of a semiconductor device according to some embodiments of the present inventive concept.

FIG. 8 is a cross-sectional view of a semiconductor device 800 according to some embodiments of the present inventive concept.

Referring to FIG. 8, the semiconductor device 800 includes a word line 820 extending in a first direction, a bit line 830 extending in a second direction different from the first direction, and the elastic channel transistor 100. The semiconductor device 800 of FIG. 8 may further include a first p-n junction region 840 and a second p-n junction region 850.

For easier understanding, although both the word line 820 and the elastic channel transistor 100 are shown in FIG. 8, the word line 820 exists on a plane different from a plane on which the elastic channel transistor 100 is disposed, and thus the word line 820 and the elastic channel transistor 100 do not meet each other. For the same reason, a fifth contact plug 876 for connecting the second p-n junction region 850 and the word line 820 exists on a plane different from the plane on which the elastic channel transistor 100 is disposed.

Examples of the substrate 810, which is a semiconductor substrate, may include a silicon substrate, a silicon-germanium (SI—Ge) substrate, and a silicon-on-insulation (SOI) substrate. A device isolation film 880 defines active regions, and may be a local oxidation of silicon (LOCOS) type device isolation film or a shallow trench isolation (STI) type device isolation film. Although the device isolation film 880 is an STI type device isolation film in FIG. 8, the example embodiments are not limited thereto. The active regions 120 may extend in the second direction.

Each of the first p-n junction region 840 and the second p-n junction region 850 may include a p-well region, an n-type impurity region, and a p-type impurity region, and forms a p-n junction to transmit charges in one direction.

A first wiring layer 861 connects a first logic element region LOGIC ELEMENT1 and a first contact plug 871. The first contact plug 871 connects the first wiring layer 861 and the p-type impurity region of the first p-n junction region 840. A second contact plug 872 connects the n-type impurity region of the first p-n junction region 840 and a second wiring layer 863, and the second wiring layer 863 is connected to the gate region 110 through a third contact plug 873. Accordingly, the gate region 110 of the elastic channel transistor 100 is electrically connected to the first p-n junction region 840.

The gate region 110 is connected to the n-type impurity region of the second p-n junction region 850 through a fourth contact plug 874, and the p-type impurity region of the second p-n junction region 850 is connected to the word line 820 through a sixth contact plug 876.

The first electrode 151 is connected to the bit line 830 through a fifth contact plug 875, and the second electrode 153 is connected to the substrate 810 through a seventh contact plug 877, a third wiring layer 356, and an eighth contact plug 878. Accordingly, the first electrode 151 may be electrically connected to a second logic element region LOGIC ELEMENT2 through the substrate 810.

Each of the first through eighth contact plugs 871, and 878 may include one or more from among, for example, polysilicon, aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), thallium (Te), titanium (Ti), tungsten (W), zinc (Zn), and/or zirconium (Zr).

The structure of the semiconductor device 800 illustrated in FIG. 8 is exemplary, and the present embodiment is not limited thereto.

Figure 9:
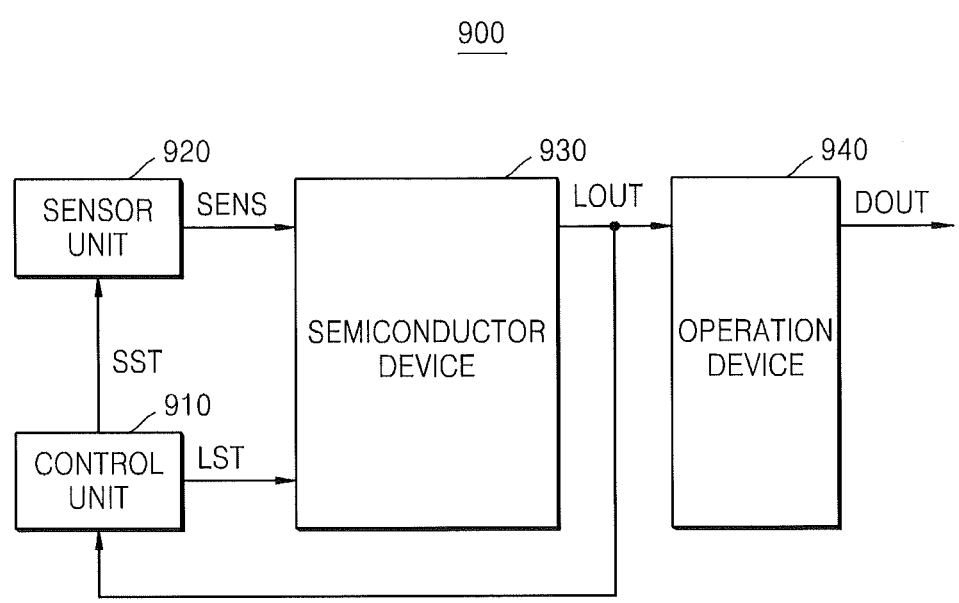
FIG. 9 is a block diagram of an automatic logic design system including a semiconductor device, according to some embodiments of the present inventive concept.

FIG. 9 is a block diagram of an automatic logic design system 900 including a semiconductor device 930, according to some embodiments of the present inventive concept.

The automatic logic design system 900 may include a control unit 910, a sensor unit 920, the semiconductor device 930, and an operation device 940.

The control unit 910 may receive a logic output signal LOUT from the semiconductor device 930, and generate a logic control signal LST or a sensor control signal SST. The logic control signal LST may be used to control a voltage provided to a word line and a bit line of the semiconductor device 930, and the sensor control signal SST may be used to control the sensor unit 920 to generate a sense signal SENS and provide the sense signal SENS to the semiconductor device 930.

The semiconductor device 930 may include the semiconductor devices 100, 600, 700, and 800 including the above-mentioned elastic channel transistors.

For example, the semiconductor device 930 of FIG. 9 may perform an operation that varies according to the setting step and the operating step.

In the setting step, each of elastic channel transistors included in the semiconductor device 930 may be set to have the first state or the second state. Accordingly, in the setting step, the control unit 910 may provide a voltage corresponding to each state to a bit line and a word line of the semiconductor device 930 by using the logic setting signal LST generated based on the logic output signal LOUT. The logic output signal LOUT is a result obtained by performing a logical operation on the sense signal SENS. The control unit 910 determines whether to change a logical operation of the semiconductor device 930, that is, determines an operation state of the semiconductor device 930 by determining whether the logic output signal LOUT is a desired output signal. However, the logic setting signal LST may include only information about states of the elastic channel transistors set in the setting step, and voltages provided to the semiconductor device 930 may be generated by a separate voltage generator (not shown). In the setting step, the control unit 910 may inactivate the sensor unit 920 by inactivating the sensor control signal SST.

In the operating step, the control unit 910 may inactivate the logic control signal LST, and inactivate the sensor control signal SST. Accordingly, in the operating step, the semiconductor device 930 may provide the logic output signal LOUT by performing a logical operation through combinations set in the setting step based on the sense signal SENS generated by the sensor unit 920.

The sensor unit 920 senses an external stimulus based on the sensor control signal SST, generates the sense signal SENS, and provides the sense signal SENS to the semiconductor device 930. Examples of the sensor unit 920 may include a vision sensor, a hearing sensor, an acceleration sensor, and a pressure sensor.

In the setting step, the semiconductor device 930 receives the logic control signal LST and changes states of the elastic channel transistors included in the semiconductor device 930. In the operating step, the semiconductor device 930 performs a logical operation, which is determined in the setting step, on the sense signal SENS and outputs the logic output signal LOUT.

The operation device 940 receives the logic output signal LOUT from the semiconductor device 930, performs a predetermined or set logical operation, and outputs a device output signal DOUT.

Accordingly, the semiconductor device including the elastic channel transistors may feedback a result obtained by performing an operation, that is the device output signal DOUT, and change a logical operation, thereby enabling to adaptively perform a logical operation.

The semiconductor device of FIG. 9 may be applied to a memory device using a package such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small-outline integrated circuit (SOIC), shrink small outline package (SSOP), thin small outline package (TSOP), thin quad flat pack (TQFP), system in package (SiP), multi chip package (MCP), wafer-level fabricated package (WFP), and/or wafer-level processed stack package (WSP).

According to some embodiments of the present inventive concept, the semiconductor device may control a channel to be formed based on an electrostatic force generated due to a drain or source voltage and a gate voltage by including an elastic conductive layer having flexibility and elasticity, and may have a circuit configuration that varies based on the formed channel.

It will be understood that portions in the attached drawings have exemplary shapes to promote an understanding of the present inventive concept, but the portions may be modified into various other shapes. The same reference numerals in the drawings denote the same elements.

What is claimed is:

1. A semiconductor device comprising an elastic channel transistor, the semiconductor device comprising:
   a gate region comprising a first area;
   an insulating layer disposed on portions of a top surface of the gate region corresponding to both side end portions of the first area;
   first and second electrodes formed on the insulating layer to be spaced apart from each other;
   an elastic conductive layer disposed between the first and second electrodes and the insulating layer; and
   a gate insulating region disposed between the elastic conductive layer and the first area of the gate region,
   wherein the elastic conductive layer is deformable to be spaced apart from or to be adjacent to the gate insulating region by an electrostatic force based on voltages applied to the first electrodes, the second electrodes and the gate region.

2. The semiconductor device of claim 1, wherein the elastic conductive layer comprises graphene.

3. The semiconductor device of claim 1, wherein the gate insulating region is a cavity defined by the gate region and the elastic conductive layer.

4. The semiconductor device of claim 1, wherein the gate insulating region is formed of a silicon oxide film, a metal oxide film, a metal silicon oxide film, or a combination thereof.

5. The semiconductor device of claim 1, wherein the first area is formed to have a round cross-sectional shape that is inwardly curved.

6. The semiconductor device of claim 1, wherein the elastic conductive layer is charged by a first control voltage applied to the first electrode,
   wherein when a voltage applied to the second electrode has substantially the same polarity as a voltage of the first control voltage that does not change a polarity of the elastic conductive layer charged by the first control voltage, a channel is determined to be formed in the elastic conductive layer based on the first control voltage and a second control voltage applied to the gate region.

7. The semiconductor device of claim 6, wherein when the second control voltage has a polarity opposite to a polarity of the first control voltage, the elastic conductive layer is spaced apart from the gate region not to form the channel.

8. The semiconductor device of claim 6, wherein when the second control voltage has substantially the same polarity as a polarity of the first control voltage, the elastic conductive layer has a channel formed therein adjacent to the gate region.

9. The semiconductor device of claim 1, wherein when a power supply voltage is not applied to the elastic conductive layer, the elastic conductive layer maintains its shape right before the power supply voltage is applied to the elastic conductive layer due to its elasticity.

10. The semiconductor device of claim 1, wherein the elastic conductive layer is formed by an exfoliation process that involves attaching single-crystal graphite to a top surface of the insulating layer and attaching part of the single-crystal graphite to the insulating layer.

11. A semiconductor device comprising an elastic channel transistor, the semiconductor device comprising:
   a gate region comprising a first area;
   an insulating layer disposed on portions of a top surface of the gate region corresponding to both side end portions of the first area;
   first and second electrodes formed on the insulating layer to be spaced apart from each other;
   an elastic conductive layer disposed between the first and second electrodes and the insulating layer and having a shape that varies according to an electrostatic force based on voltages applied to the first electrode, the second electrode, and the gate region;
   a gate insulating region disposed between the elastic conductive layer and the first area of the gate region; and
   a support structure formed on the first and second electrodes and that defines a cavity over the elastic conductive layer.

12. A semiconductor device comprising an elastic channel transistor, the semiconductor device comprising:
   a gate region that includes a top surface and a recessed area having a round cross-sectional shape that is inwardly curved and that is configured to receive a gate voltage;
   an insulating layer that is disposed on the top surface of the gate region, the insulating layer being disposed on portions of the top surface that are adjacent the recessed area;
   a first electrode that is formed on the insulating layer and that is configured to receive a control voltage;
   a second electrode that is formed on the insulating layer and that is spaced apart from the first electrode by the recessed area that is therebetween;
   an elastic conductive layer comprising graphene that is disposed between the first and second electrodes and the insulating layer and that includes a shape that varies according to an electrostatic force generated between the elastic conductive layer and the gate region based on the control voltage and the gate voltage; and
   a gate insulating region that is disposed between the elastic conductive layer and the recessed area of the gate region.

13. The semiconductor device of claim 12, wherein the elastic channel transistor is formed on the first and second electrodes and a cavity over the elastic conductive layer, the device further comprising a support structure over the cavity that is supported by a porous film.

14. The semiconductor device of claim 12, wherein
   when the control voltage has the same polarity as a polarity of the gate voltage, or when a sum of the control voltage and the gate voltage is greater than a predetermined pull-out voltage, the elastic conductive layer is spaced apart from the gate electrode so as not to form a conductive channel, and
   when the control voltage has a polarity opposite to the polarity of the gate voltage, or when a difference between the control voltage and the gate voltage is greater than a predetermined pull-in voltage, the elastic conductive layer is attached to the gate region to form a conductive channel.

15. The semiconductor device of claim 14, wherein the pull-in voltage and the pull-out voltage are determined based on a physical friction force between the elastic conductive layer and the gate insulating region, and an electrical conductivity and elasticity of the elastic conductive layer.

16. The semiconductor device of claim 12, wherein the shape of the elastic conductive layer is substantially the same shape as a shape of the first area of the gate region.

17. The semiconductor device of claim 12, further comprising:
   a word line that extends in a first direction and that is electrically connected to the gate region; and
   a bit line that extends in a second direction that is different from the first direction and that is electrically connected to the first electrode.

18. The semiconductor device of claim 17, wherein when a word line voltage is applied to the word line and a bit line voltage having substantially the same polarity as a polarity of the word line voltage is applied to the bit line, the elastic conductive layer has a conductive channel formed therein adjacent the gate region, and
   wherein the bit line voltage is provided to the second electrode in response to an output of a logic element.

19. The semiconductor device of claim 17, wherein when a word line voltage is applied to the word line and a bit line voltage having a polarity substantially opposite to a polarity of the word line voltage is applied to the bit line, the elastic conductive layer is spaced apart from the gate region and does not to form a conductive channel, and
   wherein the bit line voltage is not provided to the second electrode.

20. The semiconductor device of claim 17, further comprising:
   a first p-n junction region connected between the word line and the gate region;
   a second p-n junction region including a first terminal connected to the gate region; and
   a logic element connected to a second terminal of the second p-n junction region.

* * * * *